United States Patent
Cai et al.

(10) Patent No.: US 12,538,627 B2
(45) Date of Patent: Jan. 27, 2026

(54) LIGHT-EMITTING DIODE DEVICE AND METHOD FOR MAKING THE SAME

(71) Applicant: XIAMEN SANAN OPTOELECTRONICS TECHNOLOGY CO., LTD., Xiamen (CN)

(72) Inventors: Linrong Cai, Xiamen (CN); Lixun Yang, Xiamen (CN); Hsin-Yi Tseng, Xiamen (CN); Liqin Zhu, Xiamen (CN)

(73) Assignee: QUANZHOU SAN'AN SEMICONDUCTOR TECHNOLOGY CO., LTD., Nanan (CN)

( * ) Notice: Subject to any disclaimer, the term of this patent is extended or adjusted under 35 U.S.C. 154(b) by 585 days.

(21) Appl. No.: 17/819,693

(22) Filed: Aug. 15, 2022

(65) Prior Publication Data
US 2022/0392949 A1    Dec. 8, 2022

Related U.S. Application Data

(63) Continuation-in-part of application No. PCT/CN2020/083931, filed on Apr. 9, 2020.

(51) Int. Cl.
*H10H 29/14* (2025.01)

(52) U.S. Cl.
CPC .................. *H10H 29/142* (2025.01)

(58) Field of Classification Search
CPC ............ H01L 27/156; H01L 33/0095; H01L 33/0093; H01L 33/382; H01L 33/20; H01L 33/0066; H01L 33/12; H01L 33/44; H01L 2933/0016; H10H 29/142; H10H 20/018; H10H 20/032; H10H 20/8312;
(Continued)

(56) References Cited

U.S. PATENT DOCUMENTS

| | | | |
|---|---|---|---|
| 2010/0224897 A1* | 9/2010 | Huang | H10H 20/819 257/E33.068 |
| 2020/0044128 A1* | 2/2020 | Miki | H01L 33/36 |
| 2020/0366064 A1* | 11/2020 | McLaurin | C30B 23/025 |

FOREIGN PATENT DOCUMENTS

| | | |
|---|---|---|
| CN | 202839726 U | 3/2013 |
| CN | 107742476 A | 2/2018 |

(Continued)

OTHER PUBLICATIONS

International Search Report, PCT application No. PCT/CN2020/083931 mailed on Jan. 8, 2021 (4 pages).

*Primary Examiner* — Sitaramarao S Yechuri
(74) *Attorney, Agent, or Firm* — Thomas Horsterneyer, LLP

(57) ABSTRACT

A light-emitting diode device includes a substrate and at least one mesa structure disposed on the substrate. The substrate includes at least one light-emitting region-forming area and at least one dicing region-forming area that are spaced apart from each other. The at least one dicing region-forming area surrounds the at least one light-emitting region-forming area. The at least one mesa structure includes a light-emitting mesa disposed on the at least one light-emitting region-forming area, and a dicing mesa disposed on the at least one dicing region-forming area and surrounding the light-emitting mesa. A method for making the light-emitting diode device is also provided herein.

18 Claims, 9 Drawing Sheets

(58) Field of Classification Search
CPC .. H10H 20/01; H10H 20/0133; H10H 20/815; H10H 20/84; H10H 20/819
See application file for complete search history.

(56) References Cited

FOREIGN PATENT DOCUMENTS

| | | |
|---|---|---|
| CN | 109360843 A | 2/2019 |
| WO | 2013046545 A1 | 4/2013 |

* cited by examiner

LIGHT-EMITTING DIODE DEVICE AND METHOD FOR MAKING THE SAME

CROSS-REFERENCE TO RELATED APPLICATION

This supplication is a bypass continuation-in-part application of PCT International Application No. PCT/CN2020/083531 filed on Apr. 9, 2020. The entire content of the international patent application is incorporated herein by reference.

FIELD

The disclosure relates to a light-emitting diode, and more particularly to a light-emitting diode device and a method for making the same.

BACKGROUND

A conventional light-emitting diode device has wide applications in various fields due to its higher luminous efficiency. The conventional light-emitting diode device generally includes an epitaxial substrate, a semiconductor light-emitting unit, a sacrificial layer, an insulation layer, a metal layer, and a substrate. The semiconductor light-emitting unit is grown on the epitaxial substrate, and is then transferred to and disposed on the substrate. The metal layer is disposed between the semiconductor light-emitting unit and the substrate. The insulation layer is disposed between the metal layer and the semiconductor light-emitting unit. The sacrificial layer is disposed between the insulation layer and the semiconductor light-emitting unit. However, the semiconductor light-emitting unit, the metal layer and the substrate have different thermal expansion coefficients, and thicknesses and are formed under different growth temperature, which may cause different extent of stress present in the structure of the light-emitting diode device. In addition, because the semiconductor light-emitting unit located in a dicing region of the light-emitting diode device has a large area, continuous accumulation of stress tends to form a stress pattern in the subsequent manufacturing process, causing the semiconductor light-emitting unit to be easily broken and detached, and adversely affecting appearance, production yield and quality of the light-emitting diode device. Therefore, there is still a room for improvement in fabrication of the light-emitting diode device.

SUMMARY

An object of the disclosure is to provide a light-emitting diode device which can alleviate or overcome the aforesaid shortcomings of the prior art.

According to a first aspect, of the disclosure, a light-emitting diode device includes a substrate and at least one mesa structure.

The substrate includes at least one light-emitting region-forming area and at least one dicing region-forming area that, are spaced apart from each other. The at least one dicing region-forming area surrounds the at least one light-emitting region-forming area.

The at least one mesa structure is disposed on the substrate. The at least one mesa structure includes a light-emitting mesa disposed on the at least one light-emitting region-forming area, and a dicing mesa disposed on the at least one dicing region-forming area and surrounding the light-emitting mesa. The light-emitting mesa and the dicing mesa are spaced apart from each other. Each of the light-emitting mesa and the dicing mesa includes a semiconductor light-emitting unit which contains a first conductivity type semiconductor layer, a light-emitting layer, and a second conductivity type semiconductor layer sequentially disposed on the substrate.

According to a second aspect of the disclosure, a method for making a light-emitting diode device includes the steps of:
a) forming a semiconductor epitaxial unit on the epitaxial substrate;
b) dividing the semiconductor epitaxial unit into a plurality of semiconductor light-emitting units, the semiconductor light-emitting units being grouped into first partial semiconductor light-emitting units for light-emitting regions and second partial semiconductor light-emitting units for dicing regions, the first partial semiconductor light-emitting units being spaced apart from one another by the second partial semiconductor light-emitting units;
c) forming a first trench in each of the second partial semiconductor light-emitting units and forming a second trench in each of the first partial semiconductor light-emitting units;
d) forming a dicing path located in each of the first trenches;
e) forming a conduction column located in each of the second trenches;
f) bonding a substrate to the semiconductor light-emitting units; and
g) removing the epitaxial substrate, followed by forming the semiconductor light-emitting units to a plurality of mesa structures.

BRIEF DESCRIPTION OF THE DRAWINGS

Other features and advantages of the disclosure will become apparent in the following detailed description of the embodiments with reference to the accompanying drawings, in which.

DETAILED DESCRIPTION

Figure 1:
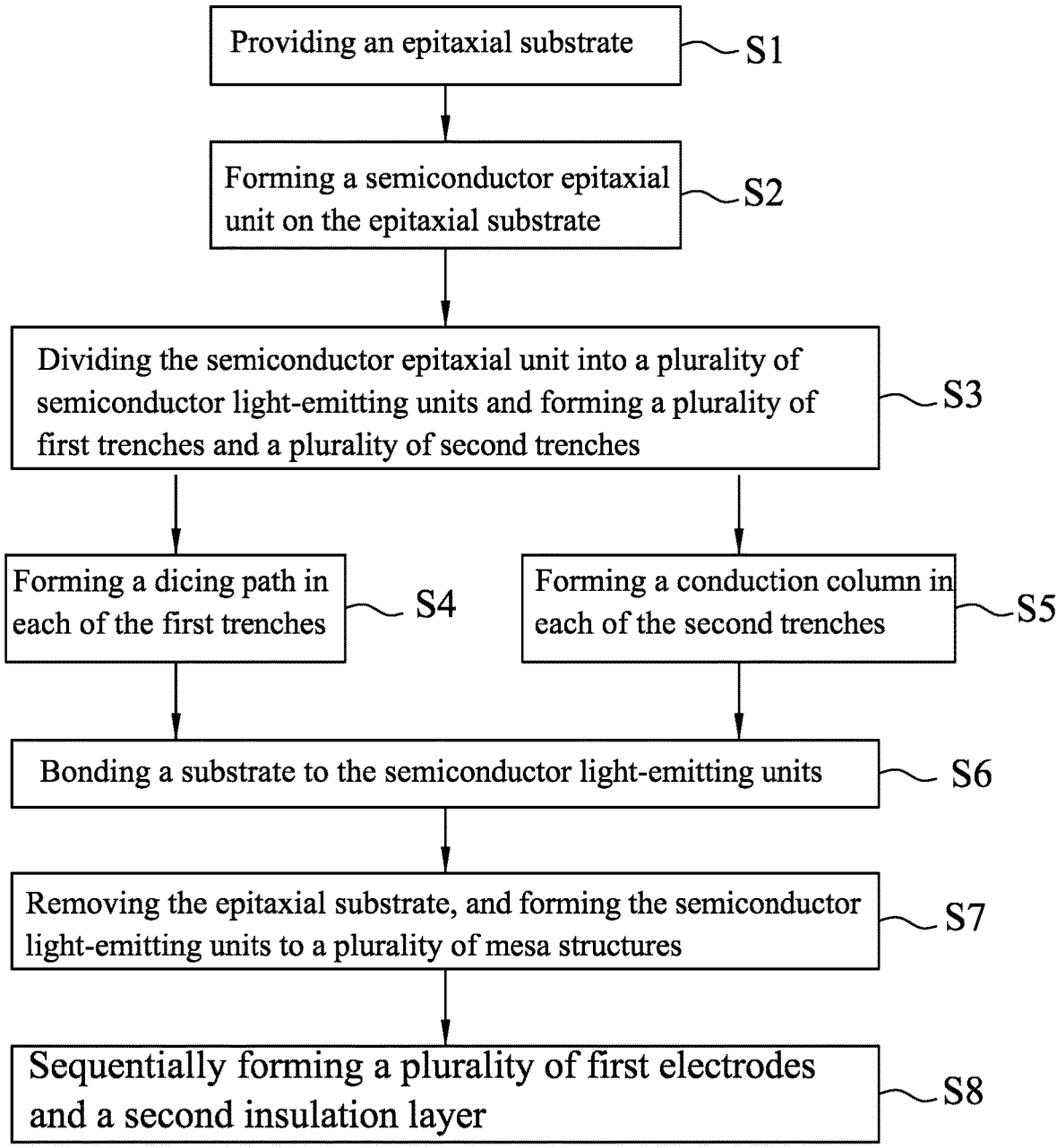
FIG. 1 is a flow chart illustrating consecutive steps of a method for making a first embodiment of a light-emitting diode device.

Before the disclosure is described in greater detail, it should be noted that where considered appropriate, reference numerals have been repeated among the figures to indicate corresponding or analogous elements, which may optionally have similar characteristics.

It should be noted that, the formation of a first, component over or on a second component in the description below may include embodiments in which the first and second components are formed in direct contact, and may also include embodiments in which additional components may be formed between the first and second components, such that the first and second components may not be in direct contact.

Referring to FIG. 1, this disclosure provides a method for making a first embodiment of a light-emitting diode device according to the present disclosure, which includes the following consecutive steps S1 to S8. FIGS. 2 to 9C illustrate intermediate stages of the method for making the first embodiment of the light-emitting diode device.

In step S1, an epitaxial substrate 100 is provided. The epitaxial substrate 100 may be a patterned sapphire substrate, a sapphire substrate, a gallium nitride substrate, an aluminum nitride substrate, a silicon carbide substrate, or a silicon substrate. In this embodiment, the epitaxial substrate 100 is a patterned sapphire substrate or a flat sapphire substrate.

Figure 2:
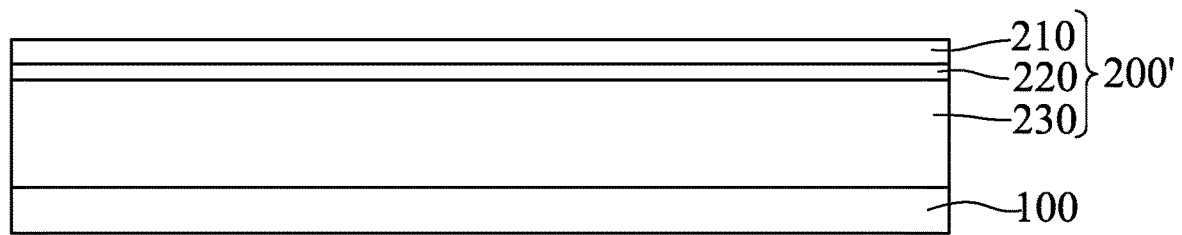
FIGS. 2 to 9C are schematic views illustrating the consecutive steps of the method for making the first embodiment of the light-emitting diode device.

In step S2, as shown in FIG. 2, a semiconductor epitaxial unit 200' is formed on the epitaxial substrate 100.

Figure 3:
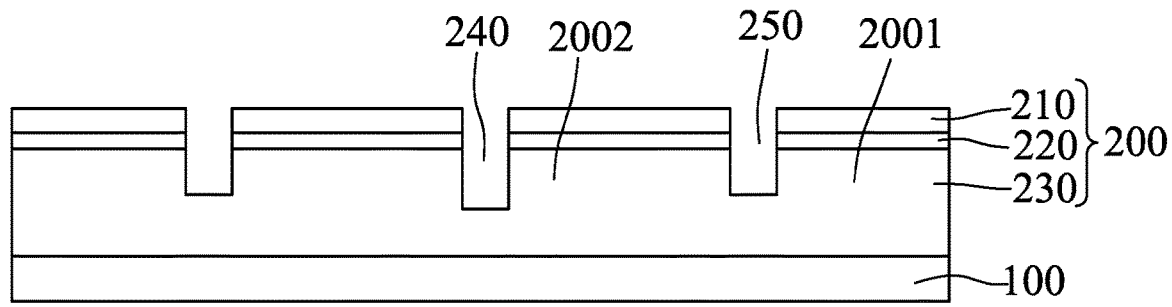
Figure 4:
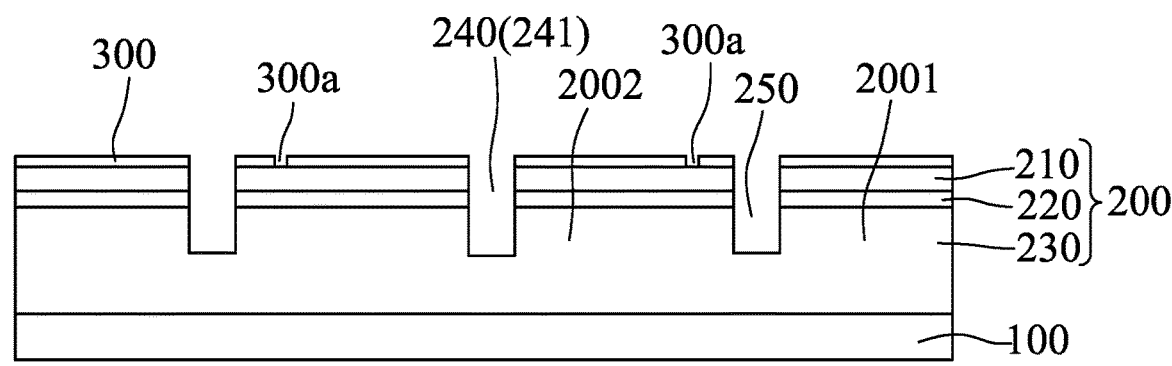
Figure 5:
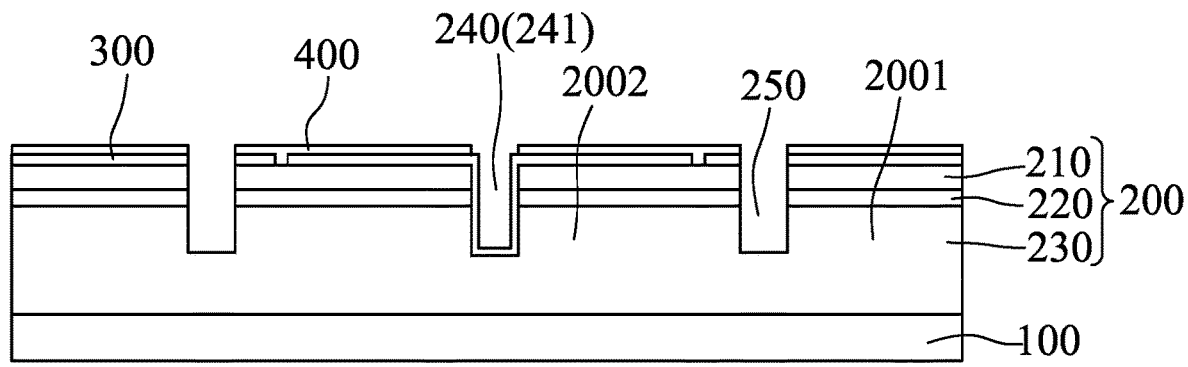

In step S3, as shown in FIG. 3, the semiconductor epitaxial unit 200' (see FIG. 2) is divided into a plurality of semiconductor light-emitting units 200. The semiconductor light-emitting units 200 are grouped into first partial semiconductor light-emitting units 2001 for light-emitting regions and second partial semiconductor light-emitting units 2002 for dicing regions. The first partial semiconductor light-emitting units 2001 are spaced apart from one another by the second partial semiconductor light-emitting units 2002. Each of the first, and second partial semiconductor light-emitting units 2001, 2002 includes a second conductivity type semiconductor layer 230, a light-emitting layer 220, and a first conductivity type semiconductor layer 210 sequentially formed on the epitaxial substrate 100. In this embodiment, the first conductivity type semiconductor layer 210 is a p-type semiconductor layer, the second conductivity type semiconductor layer 230 is an n-type semiconductor layer, and the light-emitting layer 220 is formed as a multilayered quantum well structure.

Then, a first trench 240 is formed in each of the second partial semiconductor light-emitting units 2002, and a second trench 250 is formed in each of the first partial semiconductor light-emitting units 2001. Each of the first trench 240 and the second trench 250 penetrates through the first conductivity type semiconductor layer 210, the light-emitting layer 220, and a portion of the second conductivity type semiconductor layer 230.

In step S4, as shown in FIGS. 4 to 7A, a dicing path 241 is formed and located in each of the first trenches 240, and a separation area is formed between the dicing path 241 and a corresponding one of the light-emitting regions. To be specific, step S4 may include: (i) sequentially forming a reflective metal layer (not shown) and a sacrificial layer 300 on the first conductivity type semiconductor layer 210 of the second partial semiconductor light-emitting units 2002, and on first inner walls and a first bottom wall of the second partial semiconductor light-emitting units 2002 that define each of the first trenches 240; (ii) forming a first insulation layer 500 on the sacrificial layer 300; and (iii) filling a metal layer 600 in the first trenches 240, so that the metal layer 600 is disposed on the first insulation layer 500 in the first trenches 240.

The first insulation layer 500 may include silicon oxide, silicon nitride, silicon oxynitride, titanium oxide, aluminum oxide, or combinations thereof. The metal layer 600 may include gold or gold alloy. In this step, after formation of the sacrificial layer 300 and before formation of the first insulation layer 500, the sacrificial layer 300 is partially etched to form a plurality of openings 300a, and each of the openings 300a penetrates the sacrificial, layer 300 to expose the first conductivity type semiconductor layer 210 (see FIG. 4). In addition, after formation of the openings 300a and before the formation of the first insulation layer 500, a conduction layer 400 is formed between the sacrificial layer 300 and the first insulation layer 500, fills the openings 300a, and is interrupted by the first insulation layer 500. (see FIGS. 5 and 6). (The shoulder portion of the first insulation layer 500 is connected to the sacrificial layer 300 and the conduction layer 400.)

Figure 6:
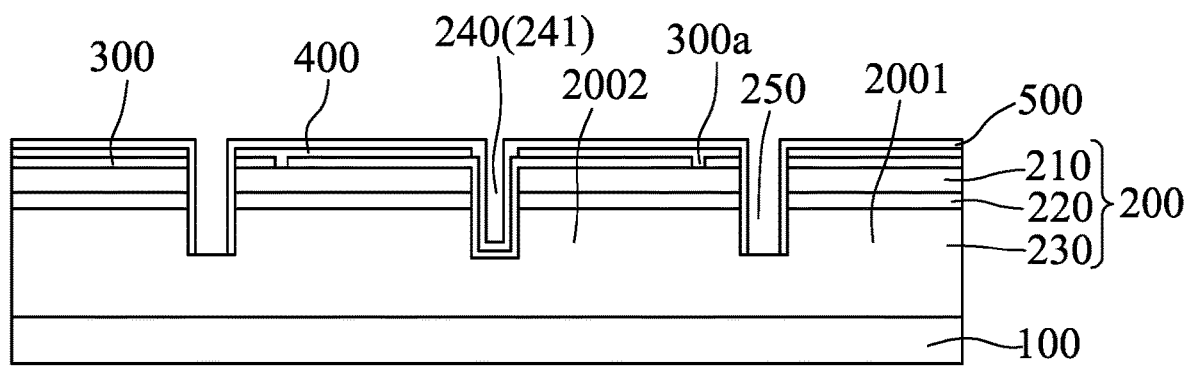
Figure 7A:
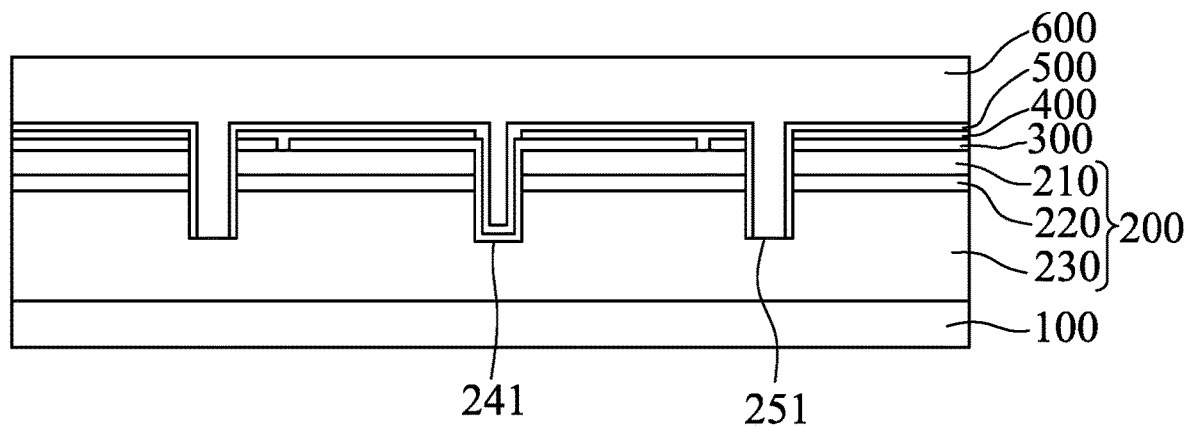

In step 35, as shown in FIGS. 6 and 7A, a conduction column 251 is formed and located in each of the second trenches 250. Step S5 may include (i) sequentially forming the reflective metal layer (not shown) and the sacrificial layer 300 on the first conductivity type semiconductor layer 210 of the first partial semiconductor light-emitting units 2001, (ii) forming the first insulation layer 500 on the sacrificial layer 300 and on first inner walls of the first partial semiconductor light-emitting units 2001 that define each of the second trenches 250, and (iii) forming the metal layer 600 in the second trenches 250, so as to form the conduction columns 251 which are respectively and electrically connected to the second conductivity type semiconductor layers 230 of the first partial semiconductor light-emitting units 2001.

Each of the conduction columns 251 is a second electrode. In this embodiment, the conduction layer 400 formed between the sacrificial layer 300 and the first insulation layer 500 is likewise interrupted by the first insulation layer 500 (see FIGS. 5 and 6).

It is noted that the dicing path 241 and the conduction column 251 may be formed in the same step (e.g., step S4) simultaneously.

Figure 7B:
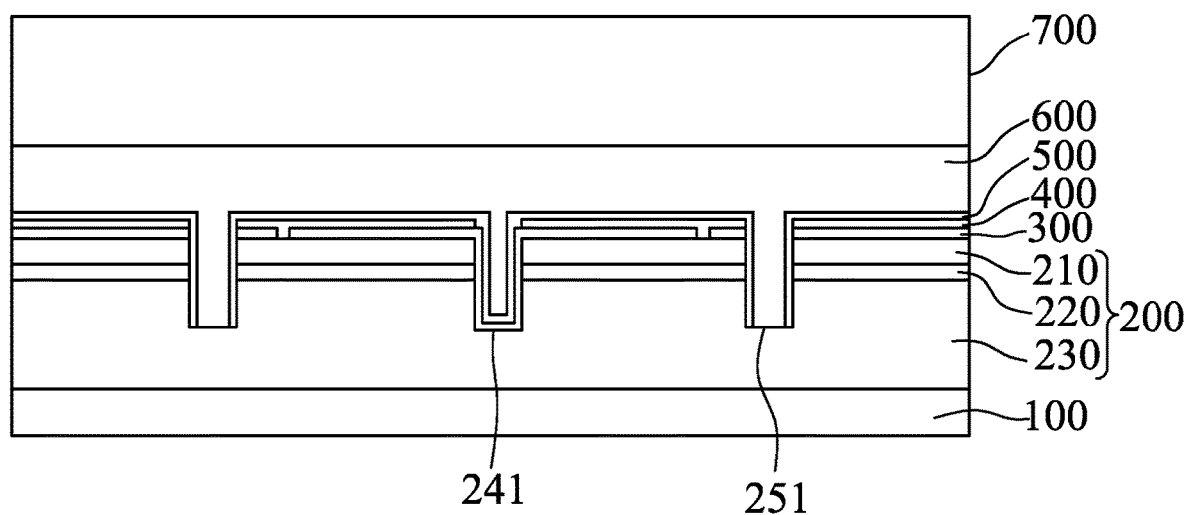

In step S6, as shown in FIG. 7B, a substrate 700, such as a permanent substrate, is bonded to the semiconductor light-emitting units 200. The substrate 700 may be made of a semiconductor material, a metallic material and a combination thereof. For example, the substrate 700 may be made of gallium arsenide (GaAs), germanium (Ge), silicon (Si), copper (Cu), molybdenum (Mo), tungsten copper (WCu), molybdenum copper (MoCu), or combinations thereof. The substrate 700 may bond to the semiconductor light-emitting units 200 through the metal layer 600 (i.e., an eutectic bonding method).

Figure 8A:
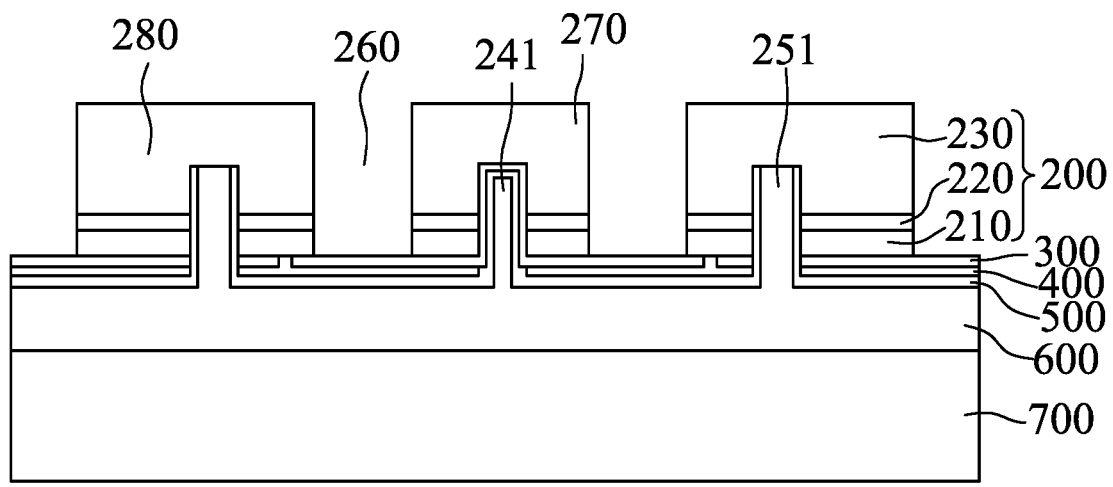
Figure 8B:
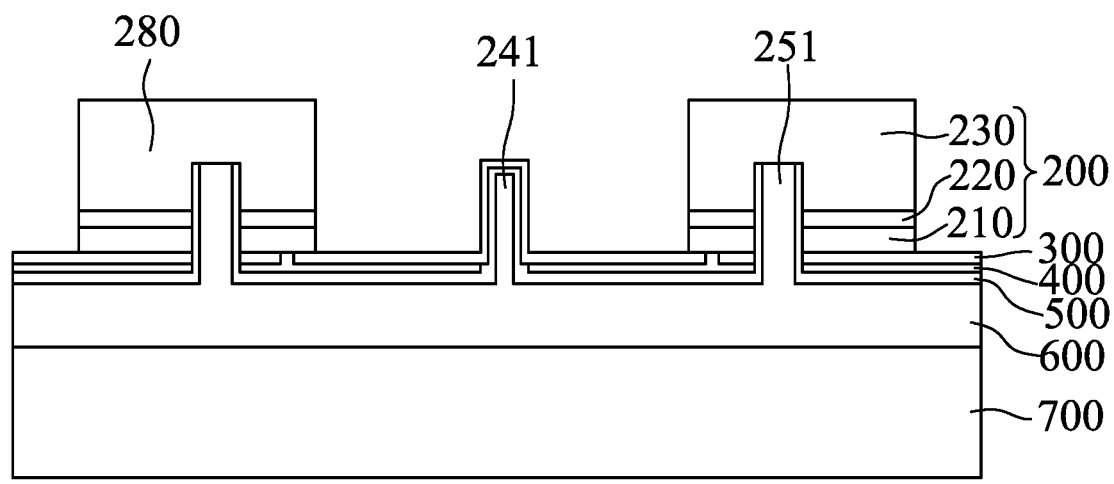

In step S7, as shown in FIGS. 8A and 8B, the epitaxial substrate 100 is removed, followed by forming the semiconductor light-emitting units 200 to a plurality of mesa structures. In this step, after the epitaxial substrate 100 is removed, a plurality of third trenches 260 are formed in the semiconductor light-emitting units 200 so as to form the mesa structures spaced apart from each other. Each of the mesa structures includes a light-emitting mesa 280 disposed on a respective one of the light-emitting regions, and a dicing mesa 270 disposed on a respective one of the dicing regions. The light-emitting mesas 280 and the dicing mesas 270 are spaced apart from each other (see FIG. 8A). In addition, the dicing mesa 270 is further etched in this step, so as to expose the dicing path 241 (see FIG. 8B).

Figure 9A:
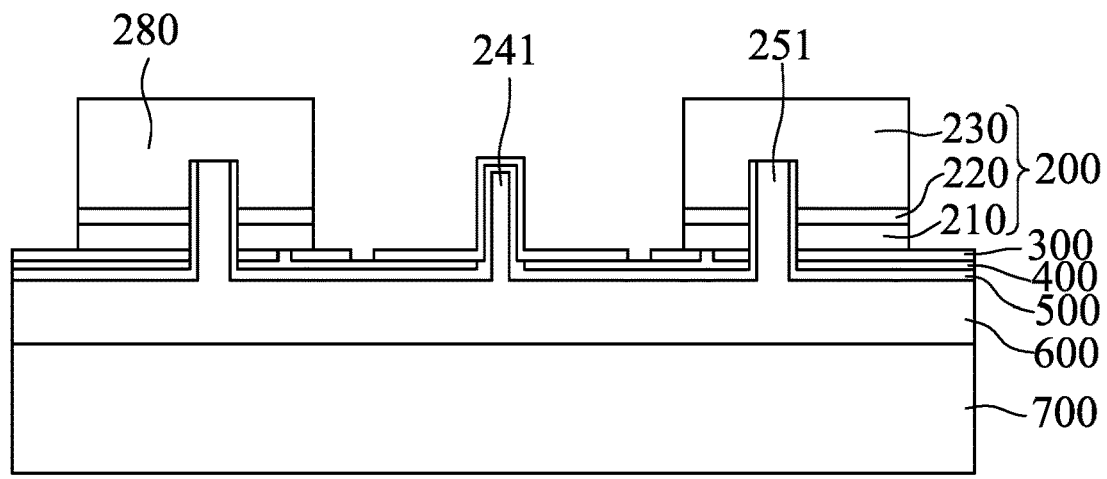
Figure 9B:
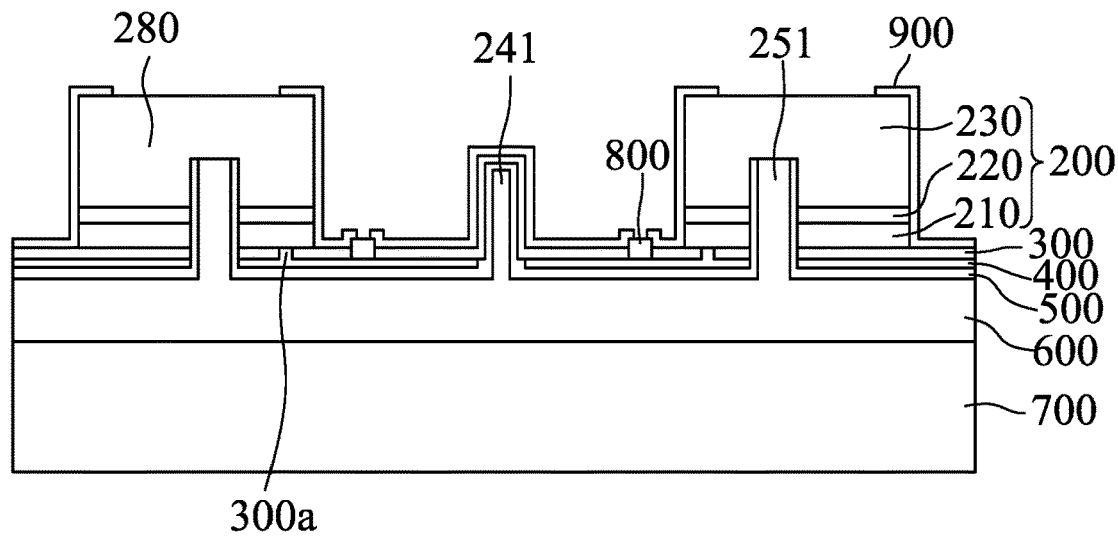

In step S8, as shown in FIGS. 9A and 9B, a plurality of first electrodes 300 and a second insulation layer 900 are sequentially formed. Step S8 may include (i) partially etching the sacrificial layer 300 located between one of the dicing mesas 270 (see FIG. 3B) and adjacent one of the light-emitting mesas 280 to expose portions of the conduction layer 400, (ii) forming the first electrodes 800 on the exposed portions of the conduction layer 400, respectively, and (iii) forming the second insulation layer 900 on the light-emitting mesas 230, the dicing mesas 270, the first electrodes 800 and the sacrificial layer 300. The second insulation layer 500 partially covers the light-emitting mesas 280 and the first electrodes 800. The first electrodes 800 may include gold or gold alloy. The second insulation layer 900 may include silicon oxide, silicon nitride or silicon oxynitride.

At least, one of the openings 300a of the sacrificial layer 300 is located in one of the light-emitting mesas 280 and proximate to one of the first electrodes 800 adjacent to the one of the light-emitting mesas 280. The first conductivity type semiconductor layer 210 forms an ohmic contact with the conduction layer 400 in the at least one of the openings 300a, so that the first conductivity type semiconductor layer 210 is electrically connected to the one of the first electrode 800 through the conduction layer 400.

By having the dicing path 242 and the conduction column 251 that are respectively formed in the first trench 240 and in the second trench 250, and by having the reflective metal layer, the sacrificial layer 300 and the first, insulation layer 500 that are included in the dicing path 241 and that are disposed in a trapezoidal manner, the direction of a stress formed in the light-emitting diode device may be effectively changed, thereby reducing a continuous accumulation of the stress, avoiding formation of a stress pattern which may cause peeling abnormality of the semiconductor light-emitting units 200, thereby effectively improving appearance and yield of the light-emitting diode device, and enhancing production quality of the light-emitting diode device.

In certain embodiments, the third trenches 230 may be formed after formation of the semiconductor epitaxial unit 200' (i.e., step S2) and before formation of the first trench 240 and the second trench 250 (i.e., step S3).

After step S8, the light-emitting diode device is therefore obtained. In this embodiment, the light-emitting diode device includes the substrate 700, the metal layer 600, the first insulation layer 500, the conduction layer 400, the sacrificial layer 300, the reflective metal layer (not shown), and the mesa structures.

The substrate 700 includes light-emitting region-forming areas spaced apart from one another by dicing region-forming areas. Each of the dicing region-forming areas surrounds a respective one of the light-emitting region-forming areas.

The mesa structures are disposed on the substrate 700, and each of the mesa structures includes a light-emitting mesa 280 disposed on the respective one of the light-emitting region-forming areas and a dicing mesa 270 disposed on the respective one of the dicing region-forming areas. The light-emitting mesas 280 and the dicing mesas 270 are spaced apart from each ether. Each of the light-emitting mesas 280 includes the first partial semiconductor light-emitting unit 2001 and each of the dicing mesas 270 includes the second partial semiconductor light-emitting unit 2002. As mentioned above, each of the semiconductor light-emitting units 200 contains the first conductivity type semiconductor layer 210, the light-emitting layer 220, and the second conductivity type semiconductor layer 230 sequentially disposed on the substrate 700. With such configuration, the semiconductor light-emitting unit 200 can have a discontinuous area, which is conducive for reducing the continuous accumulation of the stress thereon, reducing or eliminating the stress pattern and the semiconductor light-emitting unit 200 being peeled and detached, thereby effectively improving appearance and yield of the light-emitting diode device, and enhancing production quality of the light-emitting diode device. The mesa structures are transferred from the epitaxial substrate 100 on which the mesa structures are grown to the substrate 700. The metal layer 600 is disposed between the substrate 700 and the mesa structures, and the first insulation layer 500 is disposed between the metal layer 600 and the mesa structures. Each of the dicing regions includes the dicing path 241 and the separation area. Each of the dicing paths 241 is formed as a protrusion protruding from the substrate 700 and located at the respective one of the dicing regions. The metal layer 600 has filling portions respectively extending to the protrusions, the first insulation layer 500 has extending parts respectively extending to the protrusions, and each of the protrusions includes a respective one of the filling portions and a respective one of the extending parts surrounding the respective filling portion. With respect to a top surface of the sacrificial layer 300 adjacent to the first conductivity type semiconductor layer 210 of the first partial light-emitting units 2001, the protrusion may have a height different, from that of the first partial semiconductor light-emitting units 2001. Each of the light-emitting mesas 280 includes the conduction column 251 formed in the semiconductor light-emitting unit 200. The conduction column 251 penetrates through the first conductivity type semiconductor layer 210, the light-emitting layer 220 and terminates at the second conductivity type semiconductor layer 230. The conduction column 251 is electrically connected to the second conductivity type semiconductor layer 230 and the metal layer 600. The first insulation layer 500 surrounds the conduction column 251.

The light-emitting diode device further includes the first electrodes 800. Each of the first electrodes 800 is electrically connected to the first conductivity type semiconductor layer 210 of the light-emitting mesas 280. The conduction layer 400 is disposed between the first insulation layer 500 and the mesa structures, the sacrificial layer 300 is disposed between the conduction layer 400 and the mesa structures, and the reflective metal layer is disposed between the sacrificial layer 300 and the mesa structures. The sacrificial layer 300 is discontinuously located between the dicing paths 241 and the light-emitting mesa 280.

In this embodiment, the light-emitting diode device has an area not smaller than 24 inches×24 inches. Each of the semiconductor light-emitting units 200 may include group III-V compound semiconductor material (e.g., gallium arsenide (GaAs)) or group II-V based compound semiconductor material. In this embodiment, each of the semiconductor light-emitting units 200 includes group III-V compound semiconductor material that includes group III nitride (e.g., gallium nitride (GaN)) and group III phosphide (e.g., indium gallium aluminum phosphide (InGaAlP)). In addition, according to the manufacturing process and performance requirement for the light-emitting diode device, the height of each of the semiconductor light-emitting units 200 with respect to an upper surface of the sacrificial layer 300 may range from 4.5 μm to 7 μm. A distance between a top surface of each of the protrusions and a bottom surface of each of the semiconductor light-emitting units 200 may range from 0.6 μm to 1.5 μm.

Figure 9C:
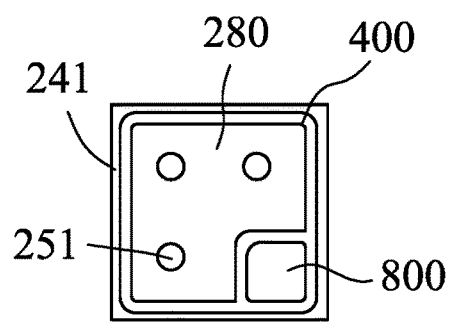

Referring to FIG. 9C, the dicing path 241 is disposed on a respective one of the dicing region-forming areas and surrounds a respective one of the light-emitting mesa 280. In certain embodiments, the conduction column 251 may also be disposed on a respective one of the dicing region-forming areas and surrounds a respective one of the light-emitting mesa 280. Each of the protrusions (i.e., the dicing paths 241) has a vertical sidewall or a slanted sidewall. A height, of the dicing path 241 with respect, to the bottom surface of each of the second partial semiconductor light-emitting units 2002 may be the same as or different from a height of the conduction column 251 with respect, to the bottom surface of each of the first partial semiconductor light-emitting units 2001. In this embodiment, the height of the dicing path 241 with respect to the bottom surface of the respective second partial semiconductor light-emitting unit. 2002 ranges from 0.6 μm to 1.5 μm. A distance between a geometry center of each of the conduction columns 251 and a geometry center of each of adjacent ones of the protrusions may range from 40 μm to 120 μm. By reducing the distance between the geometry center of each of the conduction columns 251 and the geometry center of each of adjacent ones of the protrusions, a continuous accumulation of the stress in the dicing path 241 can be reduced.

The reflective metal layer may be made of one of silver, aluminum, chromium, and alloys thereof. The conduction layer 400 may be made of one of silver, gold, titanium, aluminum, chromium, platinum, titanium-tungsten alloy, nickel, and combinations thereof. In this embodiment, the conduction layer 400 is made of one of titanium, gold, chromium, platinum, and titanium-tungsten alloy that have stable properties.

In certain embodiments, the height of each of the protrusions (i.e., the dicing paths 241) with respect to the top surface of the sacrificial layer 300 is the same as the height of the respective second partial semiconductor light-emitting unit 2002 with respect to the top surface of the sacrificial layer 300. In other words, each of the protrusions penetrates the respective second partial semiconductor light-emitting unit 2002 (before the etching process of the dicing mesas 270 as described in step S7).

Figure 10:
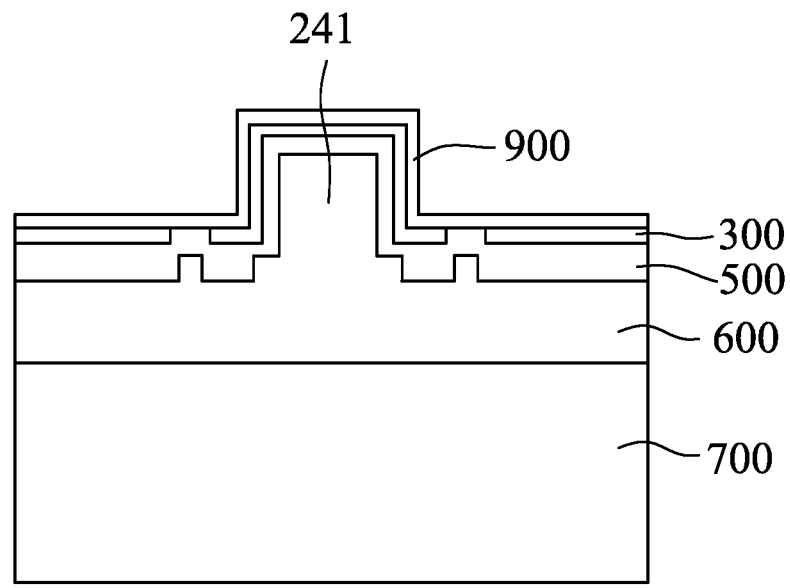
FIG. 10 is a schematic view illustrating a second embodiment of the light-emitting diode device according to the disclosure.

Referring to FIG. 10, a second embodiment of the method for making the second embodiment of the light-emitting diode device according to the present disclosure is generally similar to the first embodiment of the method, except for the following differences.

In step S4, before formation of the first insulation layer 500, a portion of the sacrificial layer 300 located at the separation area is removed to form a fourth trench (not shown) that is located between a corresponding one of the first trenches 240 and a corresponding one of the second trenches 250. The fourth trench penetrates the sacrificial layer 300 to expose the second partial semiconductor light-emitting units 2002. The first insulation layer 500 is then formed on the sacrificial layer 300 and fills the fourth trench. After that, a portion of the first insulation layer 500 is etched, and the metal layer 600 is then formed on the first insulation layer 500 and fills the etched portion of the first insulation layer 500. As such, the sacrificial layer 300 is discontinuously located between the dicing paths 241 and the light-emitting mesas 280, and the first insulation layer 500 and the metal layer 600 are cooperatively formed an inverted T-shaped structure. The inverted T-shaped structure may have a bottom part and extending parts respectively extending upwardly from the bottom part. With such inverted T-shaped structure, the direction of a stress in the first insulation layer 500 may be effectively changed, a continuous accumulation of the stress in the first insulation layer 500 may be reduced, thereby improving the appearance yield of the light-emitting diode device and enhancing the production quality of the light-emitting diode device.

Figure 11:
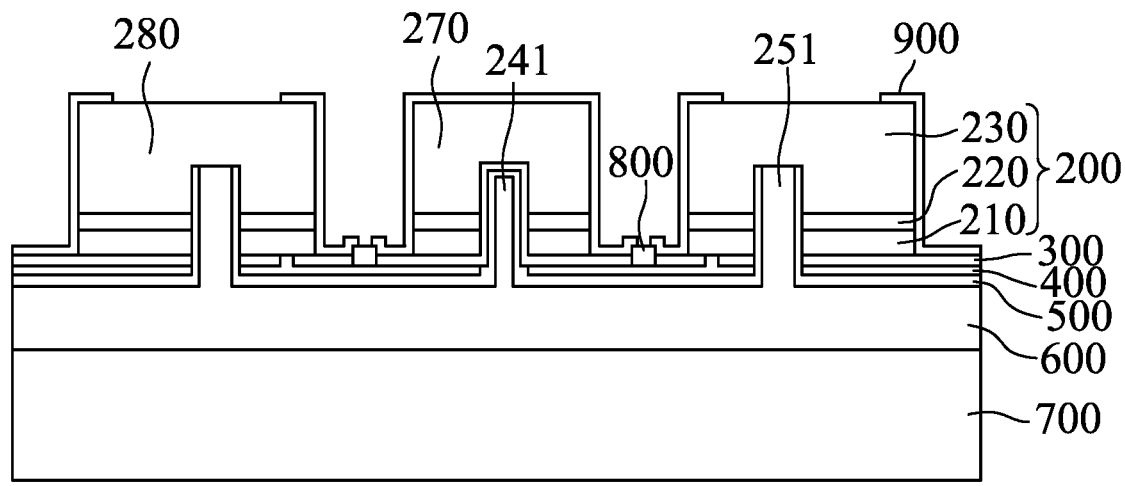
FIG. 11 is a schematic view illustrating a third embodiment of the light-emitting diode device according to the disclosure.

Referring to FIG. 11, a third embodiment of the method for making the third embodiment of the light-emitting diode device according to the present disclosure is generally similar to the first embodiment of the method, except for the following differences.

In step S7, the dicing mesas 270 are not etched or partially etched, so that the second partial semiconductor light-emitting unit. 2002 for forming the dicing mesas 27C that covers the respective protrusion (i.e., dicing path 241) and the separation area is retained.

Figure 12:
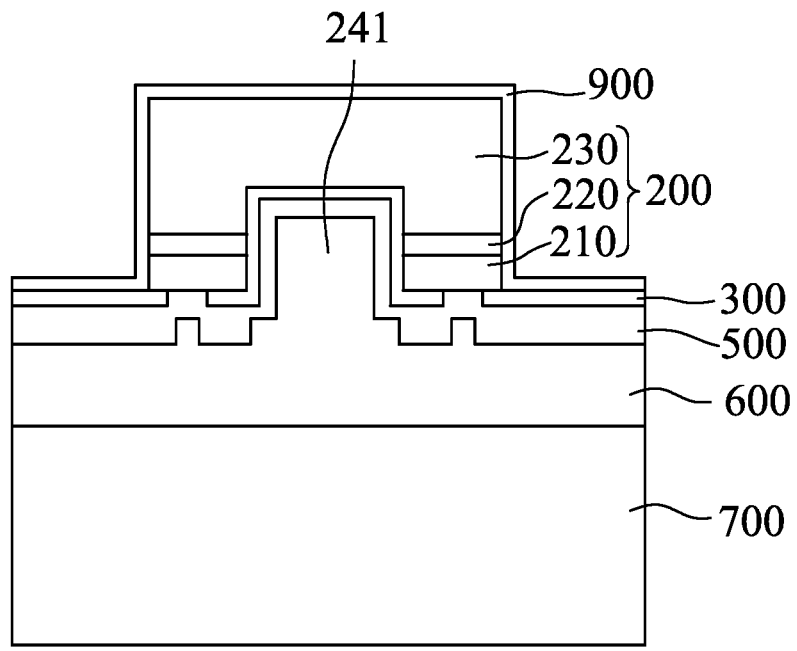
FIG. 12 is a variation of a dicing path of the third embodiment.

In a variation of the third embodiment, as shown in FIG. 12, the sacrificial layer 300 is discontinuously located between the dicing paths 241 and the light-emitting mesas 230 (not shown), and the first insulation layer 500 and the metal layer 600 are cooperatively formed an Inverted T-shaped structure.

Figure 13:
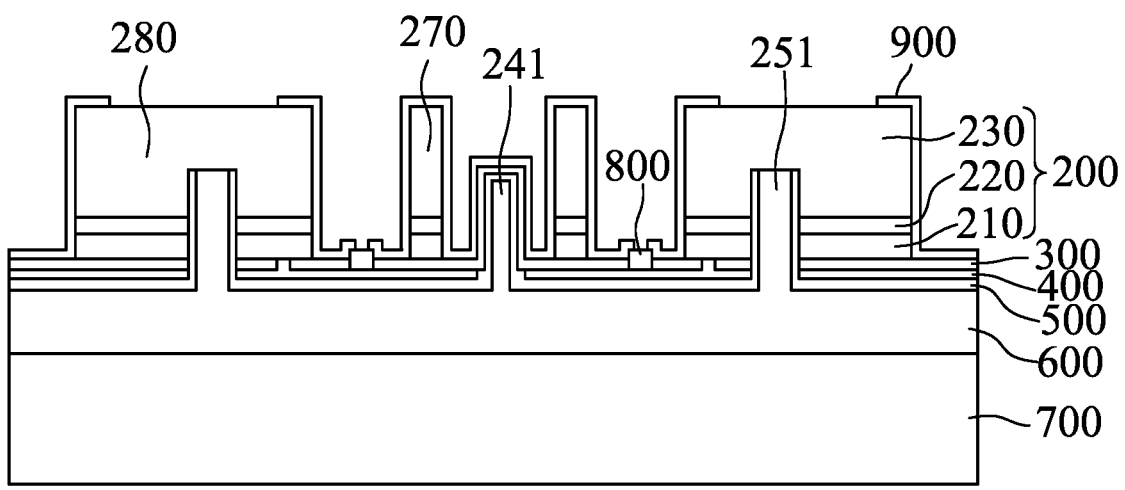
FIG. 13 is a schematic view illustrating a fourth embodiment of the light-emitting diode device according to the disclosure.

Referring to FIG. 13, a fourth embodiment of the method for making the fourth embodiment of the light-emitting diode device according to the present disclosure is generally similar to the first embodiment of the method, except for the following differences.

In step 37, each of the dicing mesas 270 is partially etched, so that a respective one of the protrusions (i.e., dicing path 241) and at least a part of the separation area is covered by the respective second partial semiconductor light-emitting unit 2002 of each of the partially etched dicing measas 270. In other words, each of the partially etched dicing meas 270 is located between the respective one of the protrusions and a respective one of the light-emitting mesas 280.

Figure 14:
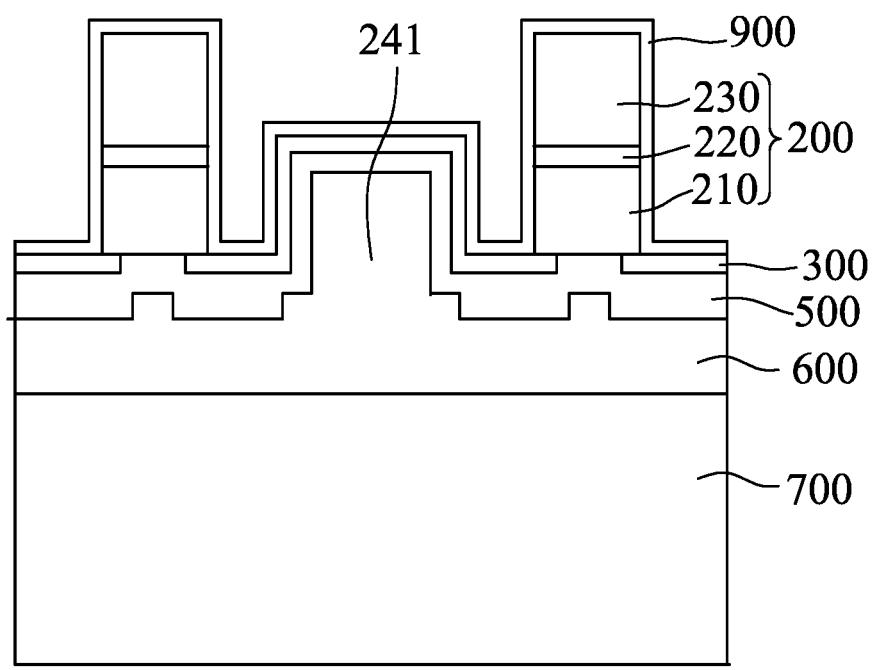
FIG. 14 is a variation of a dicing path of the fourth embodiment.

In a variation of the fourth embodiment, as shown in FIG. 14, the sacrificial layer 300 is discontinuously located between the dicing paths 241 and the light-emitting mesas 280 (not shown), and the first insulation layer 500 and the metal layer 600 are cooperatively formed an inverted T-shaped structure. In such case, the reflective metal layer located between the dicing path 241 and the semiconductor light-emitting unit 200 in the separation area is exposed, so that the light-emitting diode device is easily identified when subjected to a dicing process.

By covering the corresponding dicing path 241 and the at least a part of the corresponding separation area with the second partial semiconductor light-emitting units 2002 for forming the unetched dicing mesas 270 or the partially etched dicing mesas 270, an etchant used in the subsequent process may not easily permeate into the thin sacrificial layer 300 (located in the dicing path 241 and the separation area), the conduction layer 400 and the insulation layer 500 to corrode the metal layer 600, thereby preventing breakage of the dicing path 241.

It is noted that a material for each of the epitaxial substrate 100, the semiconductor light-emitting unit 200, the reflective metal layer, the sacrificial layer 300, the conduction layer 400, the first insulation layer 500, the metal layer 600, the substrate 700, the first electrode 800, and the second insulation layer 900 may vary depending on actual needs.

In certain embodiments, the light-emitting diode device may have a vertical structure, a horizontal structure, or a high-voltage structure.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode device, comprising:
    a substrate including at least one light-emitting region-forming area and at least one dicing region-forming area that are spaced apart from each other, said at least one dicing region-forming area surrounding said at least one light-emitting region-forming area; and
    at least one mesa structure disposed on said substrate, said at least one mesa structure including a light-emitting mesa disposed on said at least one light-emitting region-forming area and a dicing mesa disposed on said at least one dicing region-forming area and surrounding said light-emitting mesa, said light-emitting mesa and said dicing mesa being spaced apart from each other, each of said light-emitting mesa and said dicing mesa including a semiconductor light-emitting unit which contains a first conductivity type semiconductor layer, a light-emitting layer, and a second conductivity type semiconductor layer that are sequentially disposed on said substrate,
    wherein said at least one dicing region-forming area includes a dicing path and a separation area, said dicing path being formed as a protrusion protruding from said substrate and located at said at least one dicing region-forming area,
    wherein said at least one light-emitting region-forming area includes a plurality of said light-emitting region-forming areas, said at least one dicing region-forming area includes a plurality of said dicing region-forming areas, and said at least one mesa structure includes a plurality of said mesa structures, said light-emitting region-forming areas being spaced apart from one another by a respective one of said dicing region-forming areas, each of said dicing region-forming areas surrounding a respective one of said light-emitting region-forming areas, and
    wherein said light-emitting diode device further includes a metal layer disposed between said substrate and said mesa structures, and a first insulation layer disposed between said metal layer and said mesa structures.

2. The light-emitting diode device of claim 1, wherein said mesa structures are transferred from an epitaxial substrate on which said mesa structures are grown, said substrate being made of a semiconductor material, a metallic material, or a combination thereof.

3. The light-emitting diode device of claim 1, wherein said metal layer has filling portions respectively extending to said protrusions, said first insulation layer having extending parts respectively extending to said protrusions, each of said protrusions including a respective one of said filling portions and a respective one of said extending parts surrounding said respective filling portion.

4. The light-emitting diode device of claim 1, wherein a distance between a top surface of each of said protrusions and a bottom surface of said semiconductor light-emitting unit ranges from 0.6 μm to 1.5 μm.

5. The light-emitting diode device of claim 1, wherein said semiconductor light-emitting unit covers said protrusions and said separation areas.

6. The light-emitting diode device of claim 1, wherein each of said dicing mesas is located between a respective one of said protrusions and a respective one of said light-emitting mesas.

7. The light-emitting diode device of claim 1, further comprising a conduction layer disposed between said first insulation layer and said mesa structures, and a sacrificial layer disposed between said conduction layer and said mesa structures.

8. The light-emitting diode device of claim 7, wherein said sacrificial layer is discontinuously located between said dicing paths and said light-emitting mesas, said first insulation layer and said metal layer cooperatively forming an inverted T-shaped structure, said inverted T-shaped structure having a bottom part and extending parts respectively extending upwardly from said bottom part.

9. The light-emitting diode device of claim 8, wherein each of said light-emitting mesas includes a conduction column formed in said semiconductor light-emitting unit, said conduction column penetrating through said first conductivity type semiconductor layer, said light-emitting layer and terminating at said second conductivity type semiconductor layer, said conduction column being electrically connected to said second conductivity type semiconductor layer and said metal layer, said first insulation layer surrounding said conduction column.

10. The light-emitting diode device of claim 9, further comprising a plurality of first electrodes, each of said first electrodes being electrically connected to said first conductivity type semiconductor layer of said light-emitting mesas.

11. The light-emitting diode device of claim 9, wherein a distance between a geometry center of each of said conduction columns and a geometry center of each of adjacent ones of said protrusions ranges from 40 μm to 120 μm.

12. A method for making a light-emitting diode device, comprising the steps of:
    a) forming a semiconductor epitaxial unit on the epitaxial substrate;
    b) dividing the semiconductor epitaxial unit into a plurality of semiconductor light-emitting units, the semiconductor light-emitting units being grouped into first partial semiconductor light-emitting units for light-emitting regions and second partial semiconductor light-emitting units for dicing regions, the first partial semiconductor light-emitting units being spaced apart from one another by the second partial semiconductor light-emitting units;
    c) forming a first trench in each of the second partial semiconductor light-emitting units and forming a second trench in each of the first partial semiconductor light-emitting units;
    d) forming a dicing path located in each of the first trenches;
    e) forming a conduction column located in each of the second trenches;

f) bonding a substrate to the semiconductor light-emitting units; and g) removing the epitaxial substrate, followed by forming the semiconductor light-emitting units into a plurality of mesa structures, wherein in step g), after removing the epitaxial substrate, a plurality of third trenches are formed in the semiconductor light-emitting units so that the mesa structures are spaced apart from each other.

13. The method of claim 12, wherein each of the first and second partial semiconductor light-emitting units includes a second conductivity type semiconductor layer, a light-emitting layer, and a first conductivity type semiconductor layer which are sequentially formed on the epitaxial substrate.

14. The method of claim 13, wherein step d) includes the sub-steps of:

d1) sequentially forming a reflective metal layer and a sacrificial layer on the first conductivity type semiconductor layer of the second partial semiconductor light-emitting units and on first inner walls and a first bottom wall of the second partial semiconductor light-emitting units that define each of the first trenches;

d2) forming a first insulation layer on the sacrificial layer; and d3) filling a metal layer in the first trenches.

15. The method of claim 14, wherein after step d1), a portion of the sacrificial layer is removed to form a fourth trench that is located between a corresponding one of the first trenches and a corresponding one of the second trenches.

16. The method of claim 12, wherein step e) includes the sub-steps of:

e1) sequentially forming a reflective metal layer and a sacrificial layer on the first conductivity type semiconductor layer of the first partial semiconductor light-emitting units;

e2) forming a first insulation layer on the sacrificial layer and on first inner walls of the first partial semiconductor light-emitting units that define each of the second trenches; and e3) forming a metal layer in the second trenches, so that the conduction columns are respectively and electrically connected to the second conductivity type semiconductor layers of the first partial semiconductor light-emitting units.

17. A method for making a light-emitting diode device, comprising the steps of:

a) forming a semiconductor epitaxial unit on the epitaxial substrate;

b) dividing the semiconductor epitaxial unit into a plurality of semiconductor light-emitting units, the semiconductor light-emitting units being grouped into first partial semiconductor light-emitting units for light-emitting regions and second partial semiconductor light-emitting units for dicing regions, the first partial semiconductor light-emitting units being spaced apart from one another by the second partial semiconductor light-emitting units;

c) forming a first trench in each of the second partial semiconductor light-emitting units and forming a second trench in each of the first partial semiconductor light-emitting units;

d) forming a dicing path located in each of the first trenches;

e) forming a conduction column located in each of the second trenches;

f) bonding a substrate to the semiconductor light-emitting units; and g) removing the epitaxial substrate, followed by forming the semiconductor light-emitting units into a plurality of mesa structures, wherein each of the first and second partial semiconductor light-emitting units includes a second conductivity type semiconductor layer, a light-emitting layer, and a first conductivity type semiconductor layer which are sequentially formed on the epitaxial substrate, and wherein step d) includes the sub-steps of:

d1) sequentially forming a reflective metal layer and a sacrificial layer on the first conductivity type semiconductor layer of the second partial semiconductor light-emitting units and on first inner walls and a first bottom wall of the second partial semiconductor light-emitting units that define each of the first trenches;

d2) forming a first insulation layer on the sacrificial layer; and d3) filling a metal layer in the first trenches.

18. The method of claim 17, wherein after step d1), a portion of the sacrificial layer is removed to form a fourth trench that is located between a corresponding one of the first trenches and a corresponding one of the second trenches.

* * * * *